United States Patent
Burgess

(10) Patent No.: US 9,719,166 B2
(45) Date of Patent: Aug. 1, 2017

(54) METHOD OF SUPPORTING A WORKPIECE DURING PHYSICAL VAPOUR DEPOSITION

(75) Inventor: Stephen R Burgess, Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 754 days.

(21) Appl. No.: 13/528,027

(22) Filed: Jun. 20, 2012

(65) Prior Publication Data

US 2012/0325649 A1   Dec. 27, 2012

Related U.S. Application Data

(60) Provisional application No. 61/499,227, filed on Jun. 21, 2011.

(51) Int. Cl.
| | | |
|---|---|---|
| *C23C 14/00* | (2006.01) | |
| *C23C 14/32* | (2006.01) | |
| *C23C 14/35* | (2006.01) | |
| *C23C 14/50* | (2006.01) | |
| *C23C 14/54* | (2006.01) | |
| *H01J 37/32* | (2006.01) | |
| *H01J 37/34* | (2006.01) | |

(52) U.S. Cl.
CPC .............. *C23C 14/35* (2013.01); *C23C 14/50* (2013.01); *C23C 14/541* (2013.01); *H01J 37/32715* (2013.01); *H01J 37/32724* (2013.01); *H01J 37/34* (2013.01)

(58) Field of Classification Search
CPC ...................................................... C23C 14/35
USPC ....................................................... 204/192.1
See application file for complete search history.

(56) References Cited

U.S. PATENT DOCUMENTS

| | | | |
|---|---|---|---|
| 5,183,402 A | 2/1993 | Cooke et al. | |
| 5,199,483 A * | 4/1993 | Bahng | 165/80.1 |
| 6,391,437 B1 | 5/2002 | Kadomura et al. | |
| 2001/0040157 A1 | 11/2001 | Duddy et al. | |
| 2006/0032586 A1 * | 2/2006 | Choi et al. | 156/345.51 |
| 2008/0029032 A1 | 2/2008 | Sun et al. | |
| 2008/0035306 A1 | 2/2008 | White et al. | |
| 2009/0238985 A1 | 9/2009 | Chau | |

FOREIGN PATENT DOCUMENTS

| | | |
|---|---|---|
| CN | 201142322 | 10/2008 |
| EP | 0323902 A2 | 7/1989 |
| EP | 0 850 725 A2 | 7/1998 |
| EP | 1 898 457 A1 | 3/2008 |
| WO | WO2008021668 A2 | 2/2008 |

(Continued)

OTHER PUBLICATIONS

European Search Report Dated Aug. 22, 2012 in Corresponding EP Application EP 12 16 9925.

(Continued)

*Primary Examiner* — Ibrahime A Abraham
(74) *Attorney, Agent, or Firm* — Volentine & Whitt, PLLC

(57) ABSTRACT

Methods and related apparatus support a work piece during a physical vapor deposition. An aluminium support having a support surface coated with a heat absorbent coating is provided. The support is cooled to around 100° C. and a PVD process is performed such that, with cooling, the work piece temperature is between 350° C. and 450° C. The coating is inert and/or ultra-high voltage compatible.

4 Claims, 3 Drawing Sheets

(56) References Cited

FOREIGN PATENT DOCUMENTS

WO     WO 2009/061670 A2     5/2009
WO     WO 2009061670 A2     5/2009

OTHER PUBLICATIONS

Taiwanese Office Action dated Jan. 20, 2016 and search report.
Japanese Office Action dated Mar. 15, 2016 cited in corresponding Japanese Application No. 2012-137742.

* cited by examiner

| Process | Under Layer | Al Platen Grain Size (μm) | CrOx coated Platen Grain Size (μm) | Wafer Temp Al/CrOx (C) |
|---|---|---|---|---|
| Power 40kW Plater 100C | CVD oxide | 14.68 | 8.39 | 540/440 |
| Power 40kW Plater 100C | CVD ox + Ti350TiN200 | 9.04 | 8.39 | 540/440 |
| | | | | |

METHOD OF SUPPORTING A WORKPIECE DURING PHYSICAL VAPOUR DEPOSITION

BACKGROUND

This invention relates to a method of supporting of workpiece during physical vapour deposition (PVD) and physical vapour deposition apparatus including a support for a workpiece.

High powered transistors often use thick aluminium layers as contact layers in order to handle the very high current densities inherent in these devices. Thick Al films are needed to minimise contact resistance and hence switching losses, which can reduce device speeds and efficiency. Typically the devices have a vertical architecture with a source contact comprising one or more aluminium layers 1-20 μ in thickness deposited onto a semiconductor device embedded on a full thickness wafer.

Aluminium and aluminium films may be deposited onto wafers by magnetron sputtering techniques. Thus a DC power supply is connected between an aluminium target and an annular anode ring. When the system is evacuated and the part to be coated is positioned on support below the target, a low pressure discharge (typically at around several mT) is formed and material is sputtered from the target onto the wafer. Using this technique to deposit thick metal coatings can result in significant increases in the temperature of the wafer being coated as heat from the plasma and instant flux of metal ions or neutral molecules is difficult to remove in a vacuum system. However, there are frequently limits to the temperature that the wafer may attain during production and 450° C. is a common ceiling and is a typical maximum temperature for back end of line integration schemes.

In contrast productivity demands high deposition rates, which in turn leads to high DC powers of the target and these high powers result in significant heat load on the wafers.

Most commonly wafer temperature is controlled by gas conduction between the wafer and the wafer support either including the use of an electrostatic clamp or a mechanical clamping system. Whilst both these approaches work they can be relatively costly to implement in practice and their performance tends to degrade as sputtered material begins to coat the fixture.

SUMMARY OF THE INVENTION

From one aspect the invention consists in a method of supporting a workpiece during Physical Vapour Deposition (PVD) including (a) providing an aluminium surface coated with a heat absorbing coating;

(b) cooling the support to around 100° C.; and (c) operating the PVD process to such that with cooling the workpiece temperature is between 350° C. and 450° C.

Methods involving the use of a coated workpiece support are known and are, for example, disclosed in U.S. Pat. No. 5,183,402. In this patent the objective is to maintain the wafer at the platen temperature. However, aluminium has always been regarded as an unsuitable platen material for high temperature operation (>~400 C) and to date platens have been typically made with stainless steel. A person skilled in the art would not expect aluminium to require a coating because it is known to have a better thermal conductivity than stainless steel. However, as will be shown below, the inventors have determined that the coating has a substantive effect only in a particular temperature regime as set out above.

The coatings will be inert and/or ultra high voltage compatible. Example coatings are $CrO_x$ or $Al_2O_3$.

From another aspect the invention consists in a Physical Vapour Deposition apparatus including a vacuum chamber and a support disposed in the chamber for supporting a workpiece and a cooling circuit for cooling the support when the support includes an aluminium body having a support face and a support face is coated with a heat absorbing coating.

Preferably the coating is as set out above. In a particular embodiment the support is cooled to around 100° C.

The method and apparatus set out above are particularly suitable for use in high deposition of aluminium by sputtering.

Although the invention has been defined above it is to be understood that it includes any inventive combination of the features set out above or in the following description.

BRIEF DESCRIPTION OF THE DRAWINGS

The invention may be performed in various ways and specific embodiments will now be described by way of example with reference to the accompanying drawings in which.

DETAILED DESCRIPTION

Figure 1:
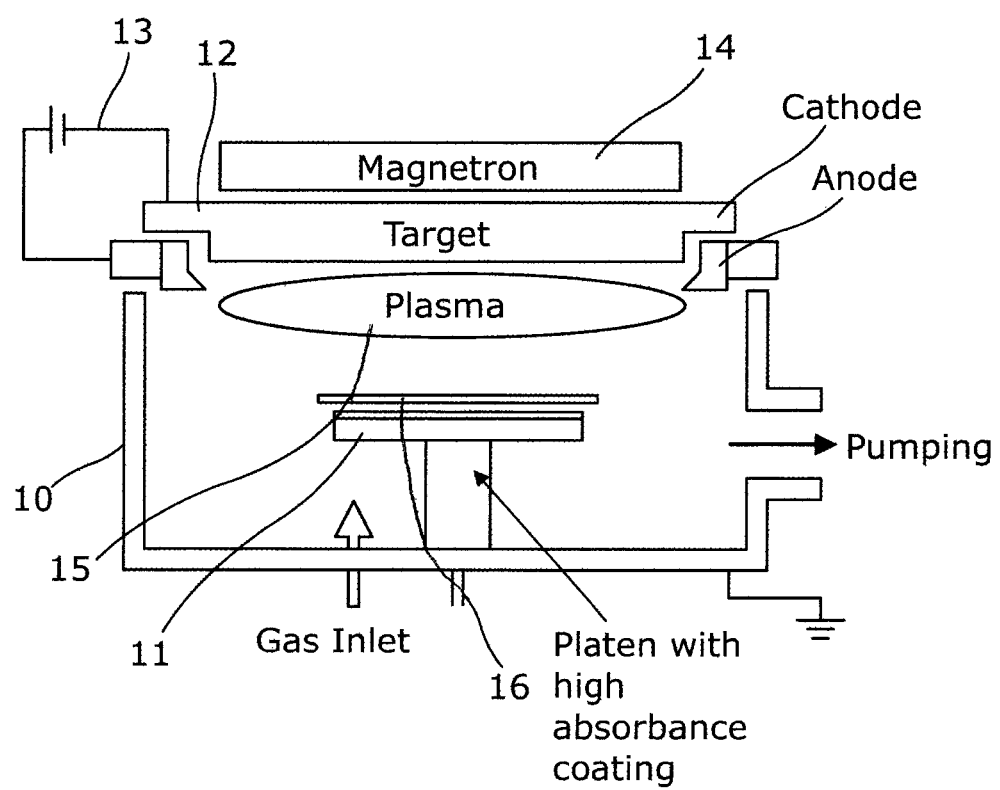
FIG. 1 is a schematic view of a sputtering apparatus.

In FIG. 1 a vacuum chamber 10 contains a support or platen 11 with an opposed target 12. As known in the art the target has a varying magnetic field generated by magnetron 14 and is powered by DC supply 14. As is also known in the art, a plasma 15 is struck within the chamber and ions are drawn to the target from the plasma to sputter aluminium from the target which descends onto wafer 16 that is carried on the support 11.

In general at above 350° C. to 400° C. a silicon wafer emits significant quantities of thermal radiation. For the most part, due for example to the aluminium coating on top of silicon dioxide layer on a silicon wafer, any heat transfer from the wafer will be restricted to the back surface of the wafer.

Figure 2:
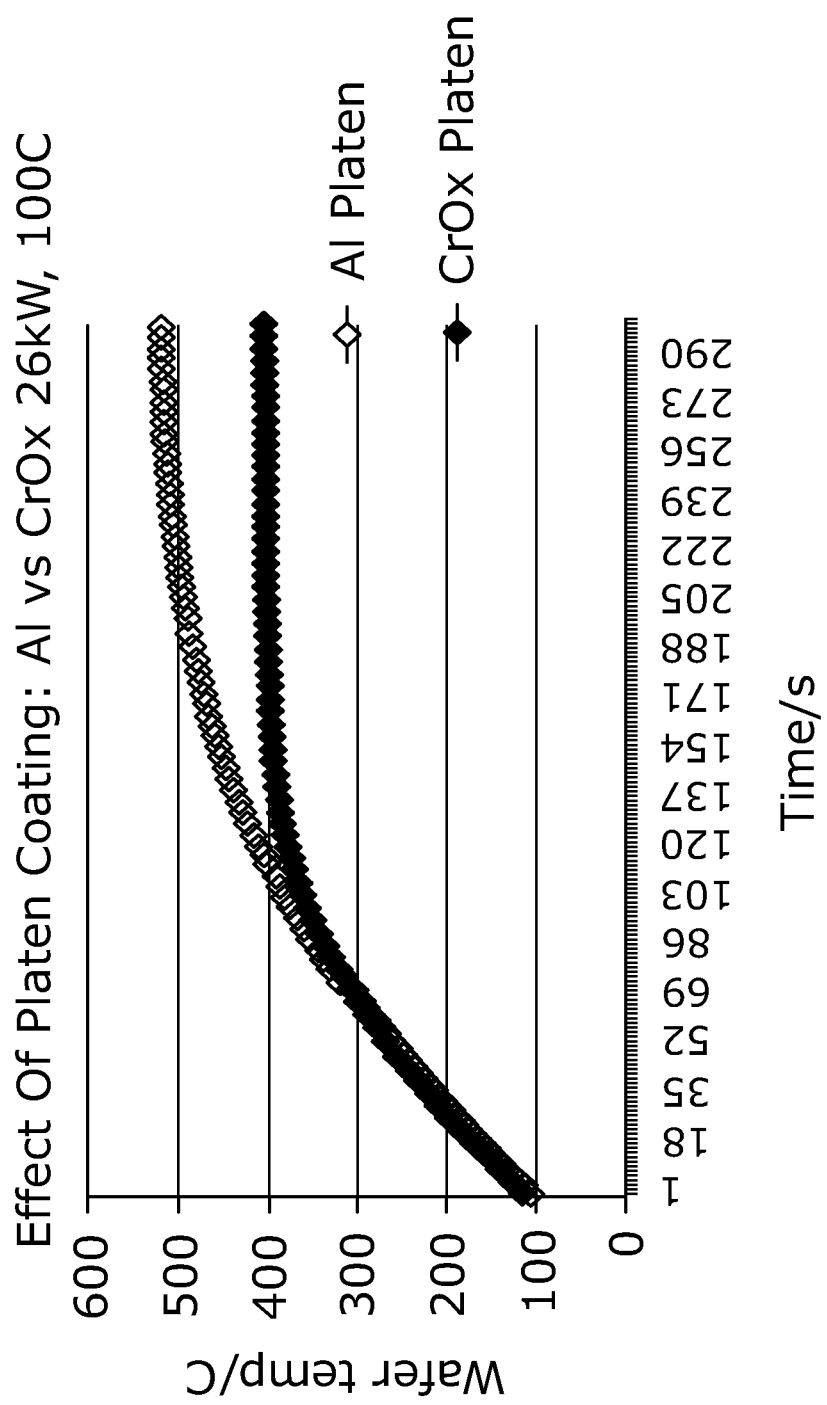
FIG. 2 illustrates the effect of the coating in a particular temperature range for a target having a 26 kw power supplied.
Figures 3, 4:
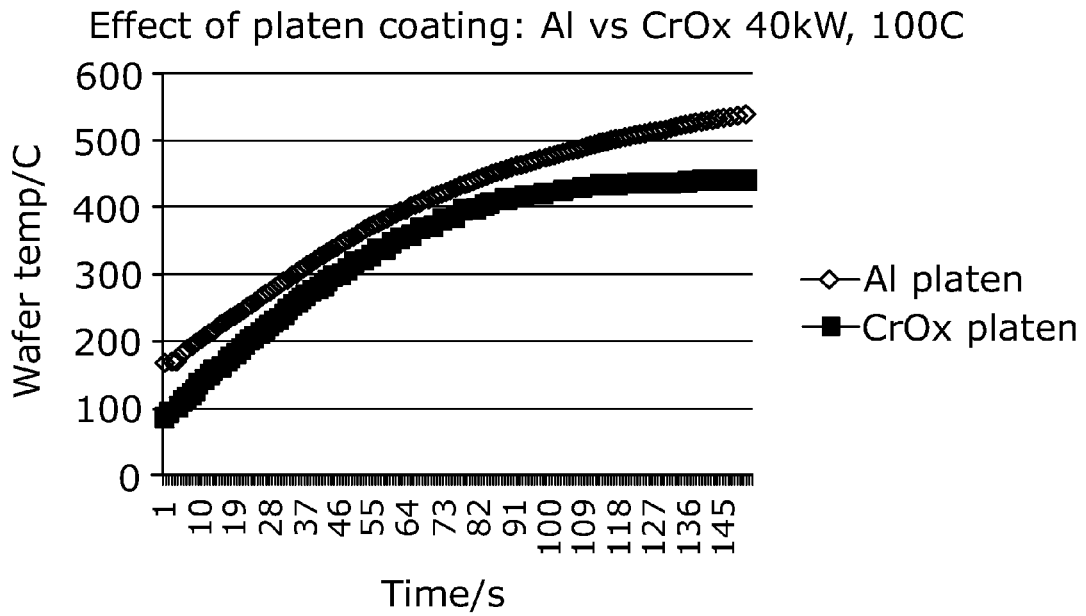
FIG. 3 is a corresponding graph for a 40 kw set up.
FIG. 4 is a table setting out wafer temperature and deposited film grain size for aluminium and aluminium/CrOx coated platen assemblies with DC power 40 kW and platen temperature controlling at 100 C.

As the Applicants were interested in high deposition rate processes involving significant powers, and hence heating, they decided to try an aluminium platen, because of its greater heat conductivity. However, as can be seen in FIGS. 2 and 3 when they experimented with an aluminium platen cooled to 100° C. for two different power regimes, they found that the wafer temperature continued to rise until it was way above 450° C. and so the process was, surprisingly, unacceptable. However, when the platen was coated with an inert ultra high voltage compatible coating, the wafer temperate flattened out at around 350° C. and in both cases kept the platen temperature below 450° C. Indeed in the first instance it was held at 400° C.

This arrangement accordingly, surprisingly, provides a very effective way of cooling the wafer in a high temperature process without the need for gas back side cooling, electrostatic clamps or even mechanical clamping systems.

FIG. 4 illustrates that the 40 kW process on an aluminium platen controlling at 100° C. results in a wafer temperature of 540° C. either on a SiO$_2$ or the SiO$_2$/Ti/TiN liner while the platen assembly with the absorbing coating maintains the wafer temperature at 440° C. The smaller grain sizes observed for the coated platen assembly are indicative of the lower wafer temperature. The process requirement for this device restricted the BEOL thermal budget to <450° C. and as such the conventional aluminium platen could not be used.

What is claimed is:

1. A method of supporting a workpiece during Physical Vapour Deposition (PVD), the method including:
    (a) providing an aluminium support having a support surface coated with a heat absorbing coating of a metal oxide film, and placing the workpiece on the metal oxide film so as to be supported by the support surface of the support;
    (b) cooling the support to 100° C.; and
    (c) executing PVD, to thereby deposit material on the workpiece, while the cooling is being carried out such that, with the cooling, the workpiece temperature is between 350° C. and 450° C. during the depositing of the material on the workpiece.

2. A method as claimed in claim 1 wherein the coating is inert and/or Ultra High Voltage compatible.

3. A method as claimed in claim 2 wherein the coating is a film of CrO$_x$ or Al$_2$O$_3$.

4. A method of supporting a workpiece during Physical Vapour Deposition (PVD), the method including:
    (a) providing an aluminium support having a support surface coated with a heat absorbing coating of CrO$_x$ or Al$_2$O$_3$, and placing the workpiece on the coating of CrO$_x$ or Al$_2$O$_3$ so as to be supported by the support surface of the support;
    (b) cooling the support to 100° C.; and
    (c) executing PVD, to thereby deposit material on the workpiece, while the cooling is being carried out such that, with the cooling, the workpiece temperature is between 350° C. and 450° C. during the depositing of the material on the workpiece.

* * * * *